(12) United States Patent
Govyadinov et al.

(10) Patent No.: US 7,342,817 B2
(45) Date of Patent: Mar. 11, 2008

(54) SYSTEM AND METHOD FOR WRITING DATA USING AN ELECTRON BEAM

(75) Inventors: Alexander Govyadinov, Corvallis, OR (US); Curt Van Lydegraf, Eagle, ID (US); David Schut, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 11/100,047

(22) Filed: Apr. 6, 2005

(65) Prior Publication Data

US 2006/0227589 A1    Oct. 12, 2006

(51) Int. Cl.
*G11C 13/00* (2006.01)
*G11C 7/00* (2006.01)

(52) U.S. Cl. .................. 365/118; 365/217; 365/163; 369/101

(58) Field of Classification Search ............. 365/118, 365/217, 189.07, 163; 369/101, 126; 250/492.3
See application file for complete search history.

(56) References Cited

U.S. PATENT DOCUMENTS

| | | | |
|---|---|---|---|
| 3,418,520 A * | 12/1968 | Barber et al. ............... 315/382 |
| 3,786,305 A * | 1/1974 | Komoda et al. ............... 315/30 |
| 4,141,405 A | 2/1979 | Spindt | |
| 4,874,981 A | 10/1989 | Spindt | |
| 5,969,355 A * | 10/1999 | Fujii et al. .................. 250/309 |
| 6,617,597 B2 * | 9/2003 | Hilton ..................... 250/492.3 |
| 6,628,052 B2 | 9/2003 | Piehl | |
| 6,686,680 B2 | 2/2004 | Shaw et al. | |
| 6,728,127 B2 | 4/2004 | Carter | |
| 6,775,223 B2 | 8/2004 | Eldredge et al. | |
| 6,891,185 B2 * | 5/2005 | Govyadinov et al. .......... 257/10 |
| 2002/0015143 A1 * | 2/2002 | Yin et al. .................... 355/133 |
| 2003/0133396 A1 * | 7/2003 | Eldredge et al. ............ 369/126 |
| 2003/0206512 A1 | 11/2003 | Ashton | |
| 2004/0135519 A1 * | 7/2004 | Benning et al. ......... 315/169.3 |

* cited by examiner

*Primary Examiner*—Richard T. Elms
*Assistant Examiner*—Douglas King

(57) ABSTRACT

A system for writing data using an electron beam to change the structure of a small section of a storage medium and includes at least one focused electron beam source. The duration of a write cycle of the focused electron beam source is controlled at least in part on an estimated or measured amount of charge transmitted by the focused electron beam source to the storage medium during the write cycle.

13 Claims, 4 Drawing Sheets

| $H_{TG}$ | $H_{GA}$ | $H_{AL}$ | $H_{LS}$ | $H_{SM}$ | $S_G$ | $S_A$ | $S_L$ | $S_S$ | $V_T$ | $V_G$ | $V_A$ | $V_L$ | $V_S$ | $V_M$ |
|---|---|---|---|---|---|---|---|---|---|---|---|---|---|---|
| 0.6 | 3 | 2 | 2 | 1 | 0.4 | 1.5 | 4 | 4 | 0±10 | 60±10 | 15 | -70±10 | $V_M$ | 700±15 |

| Write Mode | Emitter Current | Focused Spot Diameter | Potential Issue |
|---|---|---|---|
| | Decrease | Decrease | Incomplete Write |
| | Decrease | Increase | Incomplete Write |
| | Increase | Decrease | Media Damage or Ablation |
| | Increase | Increase | Over Write of Adjacent Data |
| Read Mode | Decrease | Decrease | Incomplete Write |
| | Decrease | Increase | Increased Error Rate |
| | Increase | Decrease | Unintentional Write |
| | Increase | Increase | Unintentional Write or Increased Error Rate |

FIG. 4

SYSTEM AND METHOD FOR WRITING DATA USING AN ELECTRON BEAM

BACKGROUND

Atomic resolution storage (ARS) is performed by using a beam (i.e., a focused stream of electrons) to quickly heat and change the structure of a small section of matter (i.e., the media), possibly just a few atoms across. The size of the small section impacted by the beam is referred to as the spot size, which tends to decrease as focus improves and increase as the beam becomes defocused.

In some instances, the focused stream of electrons is provided by an emitter that is part of an array of focused electron beam sources, and the section of media is one of many such sections on the surface of the storage medium. The storage medium and the array of focused electron beam sources are usually moveable relative to each other to allow one focused electron beam source to access a plurality of sections on the storage medium.

Each focused electron beam source of the array typically includes at least a field emission tip (e.g., a cathode) and a gate that is positively biased and extracts electrons from the tip. Each tip and gate pair forms a tiny electron gun, which may include some additional electrodes such as focusing lenses and/or secondary gates. To obtain a small spot size, a focusing column with additional electron focusing lenses is typically introduced between the electron gun and the media which functions as an anode. In some instances, the field emission tip may be a Spindt tip. Spindt tips are tiny conical electron emitters, and are sometimes used in field emission displays (FEDs). Similar in principle to a CRT, a FED uses a beam of electrons to excite phosphors which then emit visible light.

Field emission tips, however, tend to be very noisy, particularly when emitting into a low vacuum ($10^{-7}$-$10^{-5}$ torr). This is due at least in part to the large influence that changes in geometry and/or material properties of the tip have on the emission current. Emission current ($I_E$) is a measure of the amount of charge emitted by the field emission tip as a function of time. As such, it is difficult to get an emitter to produce a steady (i.e., relatively noiseless) emission current.

The difficulty in getting an emitter to produce a steady emission current is particularly significant in regard to ARS. For example, changing the structure of a section of the storage medium, as is frequently done in ARS, involves a balance between imparting enough energy to change the structure, and avoiding imparting so much energy that the storage medium surface is harmed, such as by ablation. Moreover, smaller spot sizes are desirable as smaller spot sizes permit higher density storage. Examples of ARS methods and apparatus which may be adapted to use the systems and methods disclosed herein can be found in U.S. Pat. No. 6,728,127, herein incorporated by reference in its entirety.

Attempts have been made to decrease or limit field emission noise (i.e., uncontrolled fluctuations of $I_E$). Such attempts include the use of backing/ballast resistors, tip FET control, and gate/extractor control. Unfortunately, each of these methods tends to have a negative affect on spot size (i.e., electron beam focus). The spot size variations can negatively impact both reading and writing of data. As such, whether heretofore recognized or not, there is a need for better systems and methods for controlling electron beam emission, particularly in ARS systems.

SUMMARY OF THE INVENTION

One embodiment of the invention includes a system for writing data using an electron beam to change the structure of a small section of a storage medium and includes at least one focused electron beam source. The duration of a write cycle of the focused electron beam source is controlled at least in part on an estimated or measured amount of charge transmitted by the focused electron beam source to the storage medium during the write cycle.

One embodiment of the invention includes a method for reading and/or writing data by using an electron beam to sense or change the structure of a small section of a storage medium includes the following: (a) using a focused electron beam source including an aperture to cause an electron beam to impact a small section of the storage medium; (b) monitoring current flow in the aperture; and (c) utilizing the monitored current flow to determine when to calibrate the focused electron beam source.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein:

FIG. 4 illustrates a table summarizing some instances of data loss during write and read processes according to an embodiment of the invention.

DETAILED DESCRIPTION

Reference will now be made to the preferred embodiments of the invention, examples of which are illustrated in the accompanying drawings. While the invention will be described in conjunction with the preferred embodiments, it will be understood that these embodiments are not intended to limit the invention. On the contrary, the invention is intended to cover alternatives, modifications and equivalents, which may be included within the spirit and scope of the invention as defined by the appended claims. In the following detailed description, numerous specific details are set forth in order to provide a thorough understanding of the invention. However, it will be understood by one of ordinary skill in the art that the invention may be practiced without these specific details. In other instances, well known methods, procedures, components, and circuits have not been described in detail so as not to unnecessarily obscure the important aspects of the invention.

Figure 1:
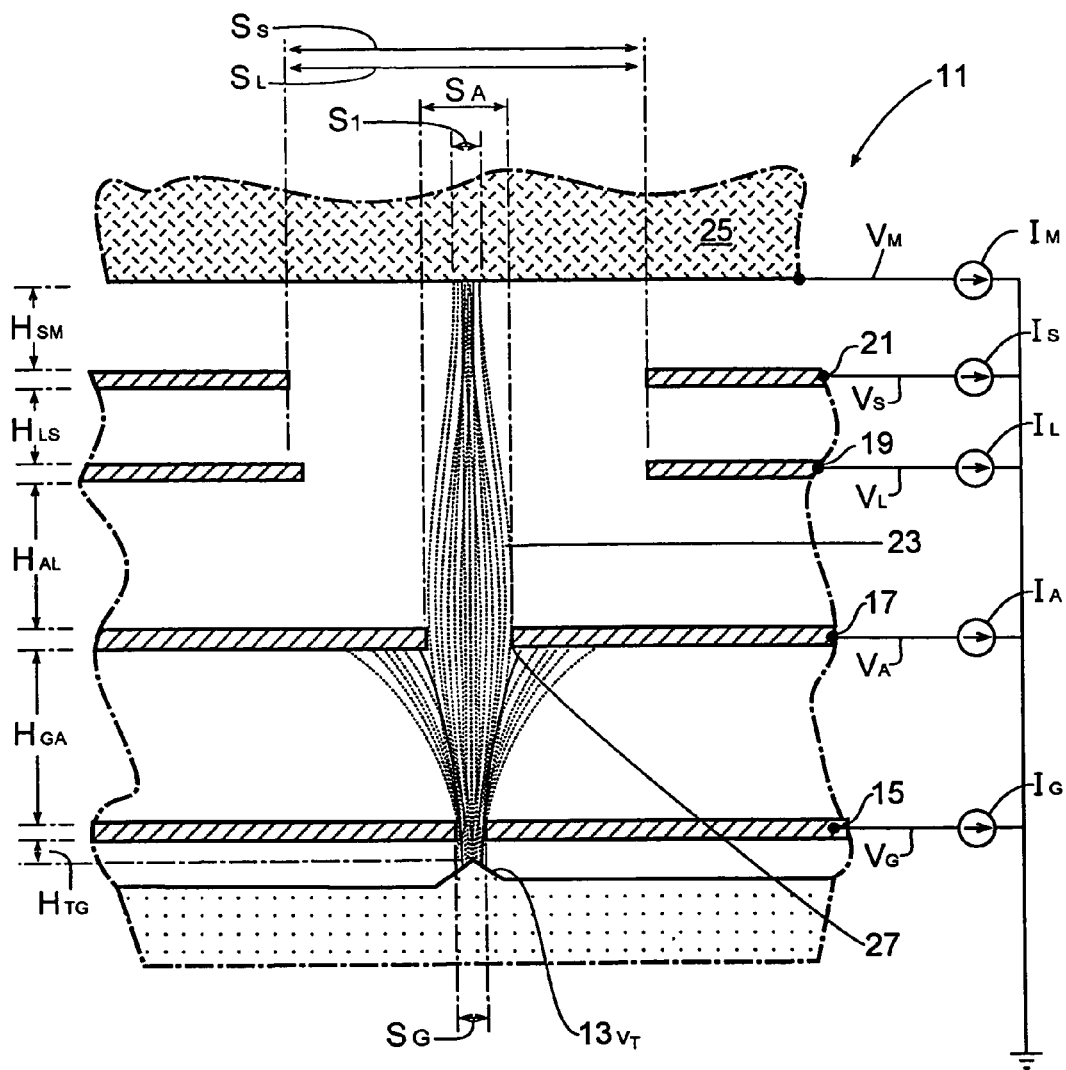
FIG. 1 illustrates a schematic diagram of a focused electron beam source according to an embodiment of the invention.

Referring to FIG. 1, a focused electron beam source (FEBS) 11 includes a field emission tip 13, a gate extractor 15, an aperture 17, a lens 19, and a shield 21. The FEBS 11 is controlled based on the amount of charge emitted by the source. The FEBS 11 control can be improved by assuming that the FEBS 11 will be subject to variations in the FEBS 11 current and spot size, and by measuring or estimating the amount of charge delivered by the FEBS 11 and/or by measuring or estimating spot size variations.

When part of an ARS system, the FEBS 11 causes an electron beam 23 to impact a storage medium 25 for writing and/or reading data on the storage medium 25. The electron beam 23 has a spot size $S_1$. It is preferred that the FEBS 11 be controlled in a manner that minimizes variations in spot size $S_1$, and possibly minimizes the impact of spot size variations when they cannot be prevented.

For illustrative purposes, the voltages of the various elements will be referred to as follows: tip voltage $V_T$, gate extractor voltage $V_G$, aperture voltage $V_A$, lens voltage $V_L$, shield voltage $V_S$, and medium voltage $V_M$. The actual voltages, and the ranges in which they are permitted to fluctuate will vary amongst the various embodiments. Acceptable values will depend in part on the nature of the storage medium 25, the relative positioning of the elements of the FEBS 11, and the size of the various openings in the anodes (i.e., the gate extractor 15, aperture 17, lens 19, and shield 21) of the FEBS 11. The distances between the elements will be referred to, as shown in FIG. 1, as $H_{TG}$, $H_{GA}$, $H_{AL}$, $H_{LS}$, and $H_{SM}$. Similarly, the size of the various openings in the anodes will be referred to as $S_G$, $S_A$, $S_L$, and $S_S$. Unless otherwise specified, voltages are specified in volts, and sizes/distances in micrometers. The sizes for a circular opening will equal the diameter of the opening, and for a non-circular opening will equal the diameter of the smallest circle within which the opening would fit. FIG. 1 illustrates the FEBS 11 in which the values shown in the table of FIG. 2 apply.

Figures 2, 3:
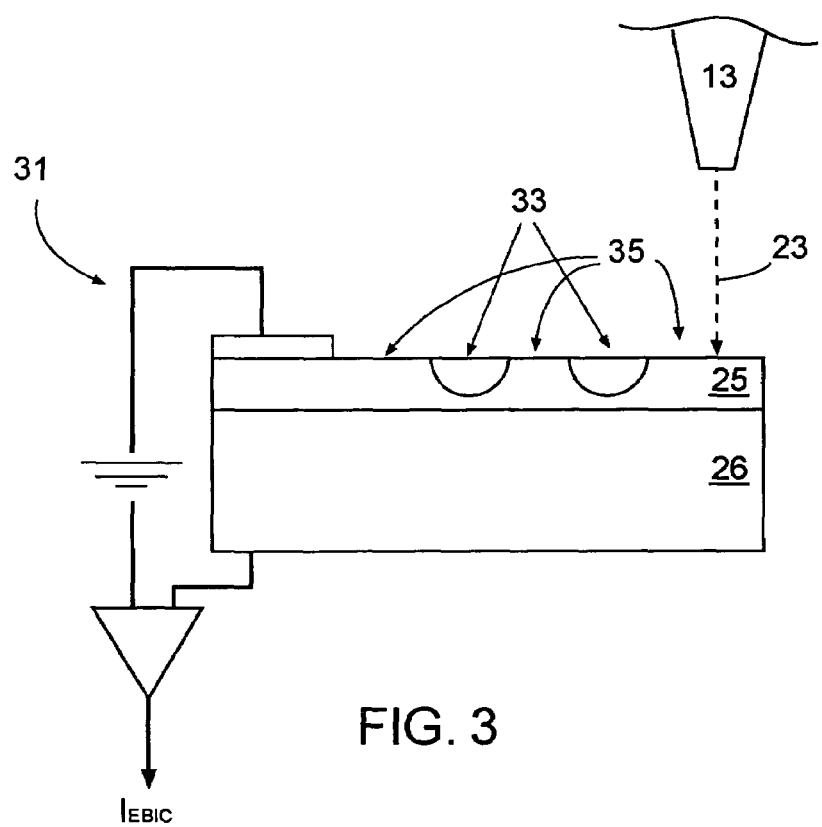
FIG. 2 illustrates a table providing exemplary values for the focused electron beam source of FIG. 1 according to an embodiment of the invention.
FIG. 3 is a schematic diagram of the focused electron beam source used for ARS according to an embodiment of the invention.

FIG. 3 shows the electron beam 23 emitted from the tip 13 of the FEBS 11 being directed toward the storage medium 25, which is coupled to a substrate 26. The FEBS 11 is used to create a phase change in the storage medium 25 by changing the electron/hole pair recombination kinetics of the storage medium 25, and hence the signal output which is read through $I_{EBIC}$ (electron beam induced current, sometimes referred to herein as $I_M$). The electron beam 23 strikes the storage medium 25, generating electron/hole pairs which are amplified with the diode created. The current $I_{EBIC}$ is then read using an apparatus 31 which may be an electrometer, a sense amplifier, or read channel electronics. The rate of recombination for the crystalline area 35 of the storage medium 25 is much less than that for the amorphous regions 33 of the storage medium 25. Hence, the crystalline area 35 exhibit a higher $I_{EBIC}$ signal than the amorphous regions 33, which are amorphous or polycrystalline.

In order to minimize spot size variation, the voltages of the various elements of the FEBS 11 are preferably kept stable during a bit write cycle and/or a bit read cycle. As used herein, a bit write cycle includes the time and steps needed to modify the structure of a small section of the storage medium 25 that represents a single unit of storage and generally equates to a bit. Similarly, a bit read cycle includes the time and steps needed to determine whether the structure of an area associated with a single unit of the storage medium 25 has been written to one of two stable states.

The variations in element voltages ($V_T$, $V_G$, $V_A$, $V_L$, $V_S$), and the media voltage $V_M$ to some extent, may have a negative impact on the spot size. As such, it is preferred that the FEBS 11 be controlled to (a) prevent or at least minimize changes of element voltages during a write cycle, and (b) prevent writing and possibly reading when spot size variations exceed acceptable levels.

Uncontrolled variations in the spot size and the FEBS current during operation of the storage medium 25 may be problematic for a number of different reasons, some of which may increase the probability of data loss. Some examples of instances where data loss may occur are shown in FIG. 4. Instances of likely data loss during the write process may include: (a) if the FEBS current (charge flow as a function of time) increases and the spot size increases, there is a possibility of overwriting data stored in locations (tracks) adjacent to the data intentionally being written; (b) if the current decreases or the spot size increases, the energy per unit area may be too small to effectively write the data; and (c) if the current increases and the spot size decreases then the energy density could be high enough to ablate or permanently damage the media. Instances of likely data loss during the read process may include: (a) if the current increases or the spot size decreases the energy density can increase to the point that an inadvertent write will occur resulting in data loss; (b) if the current decreases or the spot size increases the resulting read signal will decrease relative to the system noise resulting in a degraded error rate. However, in all such instances, the risk of data loss can be decreased by controlling the FEBS voltages and charge flow.

Element voltage changes can be reduced by permitting fluctuations in the FEBS current $I_E$. However, having $I_E$ fluctuate during a write cycle has an impact on the duration of the write cycle as it impacts the amount of charge ($Q_M$) delivered to the storage medium 25. As such, the duration of the write cycle $T_W$ is controlled at least in part based on the amount of charge $Q_M$ delivered to the storage medium 25 during the write cycle. In some instances, $Q_M$ may be measured directly or estimated from a measured characteristic change of the storage medium 25. $Q_M$ may also be calculated or estimated based on measured changes in characteristics of one or more elements of the FEBS 11. The phrase "based on," as used herein, indicates that the value that control is based on. In one embodiment, the amount of charge $Q_M$ delivered, is monitored, and that change or lack of change in the monitored value may cause a controller to change the operation of the FEBS being controlled. In this embodiment, a change or lack of change in the amount of charge $Q_M$ delivered may cause the controller to vary the duration of the write cycle $T_W$.

If $Q_M$ is to be measured or estimated from a measured characteristic change of the storage medium 25, any apparatus and/or method for obtaining $Q_M$ may be used. However, monitoring both the $I_M$ as measured by the input to a read channel and the $I_A$ as measured by circuitry connected to the aperture may prove advantageous. An apparatus 101 for doing so is depicted in FIG. 5.

Figure 5:
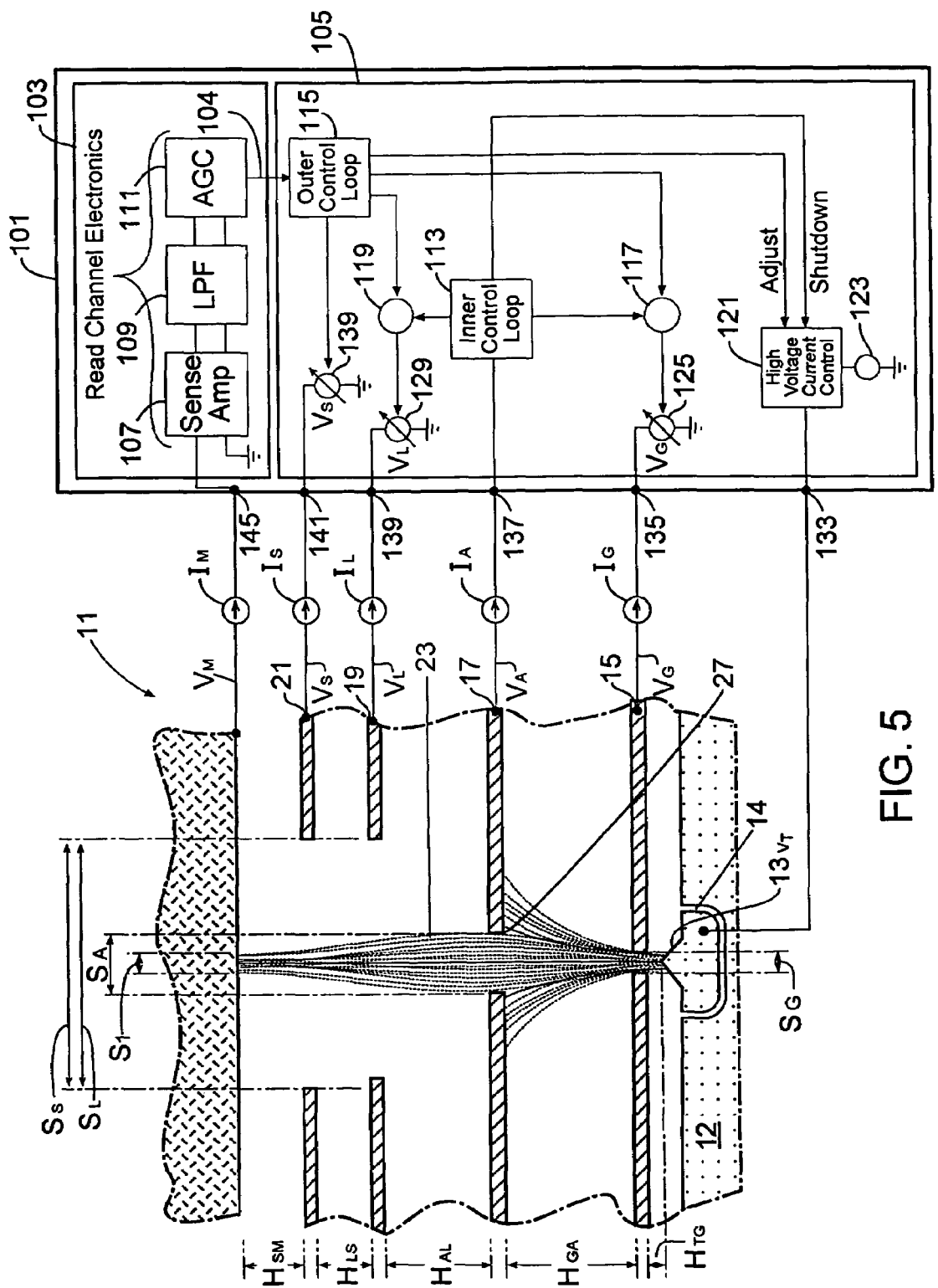
FIG. 5 is a schematic diagram of a controller coupled to the focused electron beam source of FIG. 1 according to an embodiment of the invention.

FIG. 5 is a schematic diagram of an apparatus 101 (e.g., a controller) coupled to the FEBS 11 of FIG. 1. The schematic diagram is provided primarily to facilitate discussion on control methods rather than to specify a particular apparatus to be used. As such, the apparatus 101 may in some embodiments include a plurality of apparatus, and any such apparatus may include only a portion of the depicted elements or may include additional elements. The elements of the apparatus 101 in some embodiments may include but are not necessarily limited to: electrostatic voltmeters, electrostatic field meters, and/or sensors for sensing temperature changes in the storage medium 25 or portions of the storage medium 25. Any apparatus may be used in place of the apparatus 101 so long as the FEBS 11 is controlled as described herein.

The apparatus 101 may include a read write channel electronics unit (RWCEU) 103, and a control unit 105. The RWCEU 103 may include a plurality of components such as a sensor/amplifier module 107, a low pass filter 109, and a gain control 111. The RWCEU 103 typically performs a variety of functions relating to reading from and writing to the storage medium 25. For example, the RWCEU 103 may provide a feedback signal 104 based on sensed values for $I_M$, and transmit that signal to the control unit 105.

In addition, the control unit 105 may include an inner control loop unit 113, an outer control loop unit 115, a gate summer 117, a lens summer 119, a high voltage current control 121, a tip voltage source 123, a variable gate voltage source 125, a variable lens voltage source 129, and a variable shield voltage source 139. The inner control loop unit 113 utilizes information relating to $I_A$ to assist in controlling $V_L$, $V_G$, and $I_T$ and is used to monitor $I_A$. The outer control loop unit 115 utilizes information relating to $I_M$ to control $V_S$, and to assist in controlling $V_L$, $V_G$, and $I_T$ and is used to monitor $I_M$. The outer control loop unit 115 can be viewed as a low bandwidth control loop at least in part because it is based on the mean value of $I_M$. The outer control loop unit 115 functions as a fine tuning knob for the FEBS 11.

The apparatus 101 may also include a port 137 for monitoring the current $I_A$, a port 145 for monitoring the current $I_M$, and ports 133, 135, 139, and 141 for controlling the voltages and/or currents of the tip 13, the gate 15, the lens 19, and the shield 21, respectively. In some embodiments that read or write data, the RWCEU 103 may be utilized for reading or writing.

One measure of the energy incident on the storage medium 25 is based on the signal processed by the RWCEU 103, however, the method used to store data on the storage medium 25 also modifies the resulting $I_M$. As such, feedback based on instantaneous values of $I_M$ may not be beneficial. When an increase in $I_M$ is detected, the increase in current may be interpreted as a logical "1" data bit. When a decrease in $I_M$ is detected, the decrease in current may be interpreted as a logical "0" data bit. Due to this effect, the feedback signal 104 of the RWCEU 103 is more advantageously based on the mean value of the current $I_M$ over a longer time-frame. As such, the feedback signal 104 is based on an average of multiple bits in order to determine a mean value for the current $I_M$. The feedback signal 104 is transmitted to the outer control loop unit 115 which can be optimized to adjust the FEBS voltages for optimum signal-to-noise ratio (SNR).

In addition to monitoring $I_M$, it is beneficial to monitor $I_A$. By measuring the aperture current $I_A$, it is possible to have a higher bandwidth inner control loop that is capable of monitoring changes in the FEBS focus (i.e., changes in the size of $S_1$) and/or efficiency that would result in data loss, data corruption, or abnormally poor SNR. The action taken while observing one of these conditions would likely be to (a) interrupt any ongoing write or read cycle by shutting off the high voltage current control 121 to stop the tip 13 from emitting electrons; and (b) recalibrate the emitter control circuitry 105 to adjust to the new operating point of the FEBS, preferably while the FEBS 11 is in a maintenance location.

By monitoring $I_A$ we have an indication that the FEBS is operating, i.e., that electrons are leaving the surface of the field emission tip 13 directed generally toward the storage medium 25. The majority of these electrons may not align with the aperture 27 and may be collected by the conductive surface of the aperture plate 17. The current $I_A$ collected by the aperture plate 17 is much larger than the current $I_M$ collected by the storage medium 25. As such, the current $I_A$ is much more sensitive to changes in the solid angle of the emission source than the storage medium 25, and the current $I_A$ can provide an inherently higher bandwidth signal relating to changes in output from the FEBS 11.

The current $I_A$ does not, however, represent the final energy density incident on the surface of the storage medium 25 and therefore is an incomplete signal for a control loop that attempts to regulate the focus and energy density on the storage medium 25. Despite this fact, the aperture current, $I_A$, can be effectively used for coarse control of $V_G$ and $V_L$, and for detection of conditions that exceed the limits of operability of the FEBS 11. The definition of these limits are determined by the application of the FEBS technology to a particular function. In the case of memory storage devices, it is contemplated that it is advantageous to utilize limits based on deviations of +/−10% from a steady state operating point and also based on discontinuity events. In other instances, it may be advantageous to utilize limits based on deviations of 2, 5, 7, 15, 20, and 50 percent. Exceeding these limits would cause the inner control loop unit 113 to shutdown the FEBS 11.

To improve the regulation of the electron beam energy density (both spot size and $Q_M$), it is beneficial to include input signals directly related to the collected energy. The most representative signal is the current $I_M$ collected by the sense amplifier 107 in the RWCEU 103. Use of $I_M$ has limitations in that it is an aggregate of a number of factors but does not provide individual values for those factors. Such factors include the maximum energy density at any particular location within the focused spot, and the efficiency of an electron to create electron hole pairs in the storage medium 25 which is modified by the data encoded on the surface of the storage medium 25.

An outer control loop based on $I_M$ may assume that spot size $S_1$ is determined largely by the geometry of the tip 13, apertures 15, 17 and lenses 19, 21 as well as the control of bias voltages $V_G$, $V_A$, $V_L$, and $V_S$ within acceptable ranges. These bias voltages and ranges can be established on an individual FEBS basis by calibration. The calibration of the spot size $S_1$ can be accomplished by directing the electron beam at a target that is designed to measure the effective diameter of the spot. Once the acceptable bias voltages and ranges are established for the FEBS, either through calibration or through process control, the $I_M$ signal can be used to control the magnitude of the energy density within the established spot size. The outer control loop can involve all of the control elements of the FEBS structure shown in FIG. 1. Due to the lower bandwidth of the outer control loop, it provides the quiescent operating point of the lens voltage $V_L$, and of the gate voltage $V_G$, while the higher bandwidth inner control loop modifies this operating point for transients and out of limit conditions.

The relationship between $I_A$ and $Q_M$ becomes more significant as the ratio between the gate-aperture distance $H_{GA}$ and the size of the aperture orifice $S_A$ increases. This may result from the fact that as the value of $H_{GA}/S_A$ increases, the amount of charge delivered to the aperture 17, rather than to the storage medium 25, increases.

In some embodiments it is better to interrupt a write or read cycle if the measured or estimated spot size varies beyond a predetermined amount. As such, in some embodiments a write or read cycle is interrupted if the measured or estimated $I_A$ or $I_T$ increases or decreases by a predetermined percentage. In one embodiment, using 10% as a threshold value may prove advantageous. As such, read and/or write cycles are interrupted if the measured or estimated $I_A$ or $I_T$ varies by 10% or more. The read/write cycle is interrupted when a voltage or current of a FEBS element does not fall within a predetermined range.

Interrupting the read or write cycle may be accomplished in any reasonable manner such as by defocusing, re-directing, or reducing the power of the electron beam 23, or by interrupting the flow of $I_T$ as controlled by a FET in series with the emitter cathode. The preferred embodiment of the FEBS current circuitry involves a single high voltage FET that is designed to withstand the high voltage bias required to cause the tip to emit electrons into the vacuum. The current through the FET may be regulated by using a current mirror. The current mirror has four states of operation, high write current, low write current, read current, and off. By turning the current mirror off, the high voltage FET drops nearly all of the bias potential across its source to drain contacts and the emission stops.

In some instances, defocusing may be accomplished by changing the value of $V_L$. In such instances, the change will generally be a reduction in $V_L$. In one embodiment, redirection may be done by changing the aperture voltage $V_A$. Alternatively, if there are separate addressable lines for each lens of a FEBS having multiple lenses, then redirection may occur by changing the voltage of a lens relative to the voltage of any other addressable lens for that FEBS. In some embodiments, reducing the power of the electron beam 23 may be accomplished by reducing the anode or electron extraction voltage (i.e. reducing $V_G$), or by increasing the aperture voltage $V_A$.

The embodiments described herein include multiple novel features with each described embodiment including either a single such feature or a combination of such features. Other contemplated embodiments include all combinations of one or more such novel features not explicitly described herein as such combinations are readily discernable from the embodiments described. In light of the various contemplated embodiments, the invention can be characterized in a number of ways with the following paragraphs providing examples of some such characterizations.

One embodiment includes a system for writing data using a FEBS to change the structure of a portion of a storage medium, the FEBS including an electron emitting tip, and an aperture, the aperture being conductive and including a through hole aligned with the electron emitting tip such that a first portion of the electrons emitted by the tip impact against the aperture and a second portion of the electrons emitted by the tip pass through the through hole, and at least a portion of the second portion of the electrons emitted by the tip impact against the storage medium, the system including: a controller controlling current flow to the electron emitting tip, the controller controlling current flow to the electron emitting tip based on current flow in the aperture or current flow in the storage medium. In some instances, the controller controls current flow to the tip based on current flow in the aperture and current flow in the storage medium.

The FEBS may further include a gate positioned between the electron emitting tip and the aperture, the gate being conductive and including a through hole aligned with the electron emitting tip and the through hole of the aperture, and the controller controls the voltage of the gate based on current flow in the aperture and current flow in the storage medium. The FEBS may further include a lens positioned between the aperture and the storage medium, the lens being conductive and including a through hole aligned with the electron emitting tip and the through holes of the aperture and gate, and the controller controls the voltage of the lens based on current flow in the aperture and current flow in the medium. In some such instances, the FEBS includes a shield positioned between the lens and the storage medium, the shield being conductive and including a through hole aligned with the electron emitting tip and the though holes of the aperture, gate, and lens, and the controller controls the voltage of the shield based on current flow in the storage medium but not based on current flow in the aperture. The controller switches current flow to the electron emitting tip on and off based on current flow in the aperture, and adjusts the magnitude of the current flow to the electron emitting tip based on the current flow in the storage medium. In some such instances, the controller switches off current flow to the electron emitting tip when the magnitude of the current flow in the aperture differs from a prior magnitude of the current flow in the aperture by at least a pre-determined percentage. In some instances, the pre-determined percentage is one of 2, 5, 7, 10, 15, 20, and 50.

One embodiment includes a system for writing data by using an electron beam to change the structure of a small section of a storage medium, the system including at least one electron beam FEBS wherein the duration of a write cycle of the FEBS is controlled at least in part on an estimated or measured amount of charge transmitted by the FEBS to the storage medium during the write cycle. In some embodiments, a write cycle is terminated by at least one of the following: turning off the electron beam; defocusing the electron beam; re-directing the electron beam; and reducing the power of the electron beam. The estimated or measured amount of charge is at least partially determined by measuring current flow through one or more of the storage medium, a field emission tip, a gate-extractor, an aperture, a lens, and a shield, wherein any such gate-extractor, aperture, lens or shield is a conductive member positioned between the field emission tip and the storage medium and having a through hole aligned with the field emission tip. In some embodiments, the estimated or measured amount of charge is at least partially determined by measuring a change in temperature or voltage of the storage medium.

One embodiment includes a system for writing data by using an electron beam to change the structure of a small section of a storage medium, the system including a controller that interrupts a write cycle of the FEBS if the spot size of the electron beam varies by at least a pre-determined percentage. In some instances the pre-determined percentage is one of 2, 5, 7, 10, 15, 20, and 50.

One embodiment includes a method for reading and/or writing data by using an electron beam to sense or change the structure of a small section of a storage medium, the method including: (a) using a FEBS including an aperture to cause an electron beam to impact a small section of the storage medium; (b) monitoring current flow in the aperture; and (c) utilizing the monitored current flow to determine when to calibrate the FEBS. In some embodiments, the time to calibrate the FEBS at times is determined to occur before a read or write cycle is completed and at such times results in the read or write cycle being terminated before it is completed. In some embodiments, termination of a read or write cycle is accomplished by at least one of the following: turning off the electron beam; defocusing the electron beam; re-directing the electron beam; and reducing power of the electron beam. In some embodiments, the method also includes determining a spot size of the electron beam, and stopping or reducing the transmission of charge to the storage medium if the determined spot size exceeds a threshold value. The method may further include determining a spot size of the electron beam, and stopping or reducing the transmission of charge to the storage medium if the determined spot size varies by at least a pre-determined percentage. In some instances the pre-determined percentage is one of 2, 5, 7, 10, 15, 20, and 50.

What is claimed is:

1. A system for writing data using a focused electron beam source to change the structure of a portion of a storage medium, the focused electron beam source having an electron emitting tip, and an aperture being conductive and having a through hole aligned with the electron emitting tip such that a first portion of the electrons emitted by the electron emitting tip impacts against the aperture and a second portion of the electrons emitted by the electron emitting tip passes through the through hole, and at least a portion of the second portion of the electrons emitted by the electron emitting tip impacts against the storage medium, the system comprising:

a controller controlling a first current flow to the electron emitting tip based on a second current flow in the storage medium and based on a third current flow in the aperture to begin a write cycle, wherein the controller switches off the first current flow to the electron emitting to stop the write cycle when a magnitude of the third current flow in the aperture differs from a prior magnitude of the third current flow in the aperture by at least a pre-determined percentage, and then switches on the first current flow to the electron emitting tip to continue the write cycle.

2. The system of claim 1 wherein the focused electron beam source further comprises a gate positioned between the electron emitting tip and the aperture, the gate being conductive and including a through hole aligned with the electron emitting tip and the through hole of the aperture, and the controller controls a voltage of the gate based on the current flow in the storage medium but not based on the current flow in the aperture.

3. The system of claim 2 wherein the focused electron beam source further comprises a lens positioned between the aperture and the storage medium, the lens being conductive and including a through hole aligned with the electron emitting tip and the through holes of the aperture and the gate, and the controller controls a voltage of the lens based on the current flow in the storage medium but not based on the current flow in the aperture.

4. The system of claim 3 wherein the focused electron beam source comprises a shield positioned between the lens and the storage medium, the shield being conductive and including a through hole aligned with the electron emitting tip and the though holes of the aperture, the gate, and the lens, and the controller controls a voltage of the shield based on the current flow in the storage medium but not based on the current flow in the aperture.

5. The system of claim 4 wherein the controller switches current flow to the electron emitting tip on and off based on the current flow in the aperture, and adjusts a magnitude of the current flow to the electron emitting tip based on the current flow in the storage medium.

6. The system of claim 1 wherein the pre-determined percentage is approximately 2%.

7. A method for reading and/or writing data by using an electron beam to sense or change the structure of a small section of a storage medium, the method comprising:

using a focused electron beam source including an electron emitting tip and an aperture to cause an electron beam to impact the small section of the storage medium;

monitoring a first current flow in the storage medium;

monitoring a second current flow in the aperture;

controlling a third current flow to the electron emitting tip based on the first current flow in the storage medium and based on the second current flow in the aperture;

determining a spot size of the electron beam; and utilizing the monitored first current flow in the storage medium, the monitored second current flow in the aperture, and the spot size of the electron beam to determine when to calibrate the focused electron beam source.

8. The method of claim 7 wherein a read or write cycle is terminated before it is completed to allow calibration of the focused electron beam source to occur at a time determined by utilizing the monitored first current flow in the storage medium, the monitored second current flow jn the aperture, and the spot size of the electron beam.

9. The method of claim 8 wherein termination of a read or write cycle is accomplished by at least one of the following: turning off the electron beam; defocusing the electron beam; re-directing the electron beam; and reducing power of the electron beam.

10. The method of claim 7 further comprising reducing the transmission of charge to the storage medium if the determined spot size exceeds a threshold value.

11. The method of claim 7 further comprising reducing the transmission of charge to the storage medium if the determined spot size varies by at least a pre-determined percentage.

12. The method of claim 7 further comprising interrupting a write cycle of the focused electron beam source if the determined spot size varies by at least a pre-determined percentage.

13. The method of claim 7 further comprising measuring at least one of a change in temperature and a change in voltage of the storage medium to estimate an amount of charge on the storage medium.

* * * * *

UNITED STATES PATENT AND TRADEMARK OFFICE
CERTIFICATE OF CORRECTION

PATENT NO. : 7,342,817 B2
APPLICATION NO. : 11/100047
DATED : March 11, 2008
INVENTOR(S) : Alexander Govyadinov et al.

Page 1 of 1

It is certified that error appears in the above-identified patent and that said Letters Patent is hereby corrected as shown below:

In column 10, line 30, in Claim 8, delete "jn" and insert -- in --, therefor.

Signed and Sealed this

Twelfth Day of August, 2008

JON W. DUDAS
*Director of the United States Patent and Trademark Office*